US010825783B2

(12) United States Patent
Shih et al.

(10) Patent No.: US 10,825,783 B2
(45) Date of Patent: Nov. 3, 2020

(54) SEMICONDUCTOR PACKAGES AND DEVICES

(71) Applicant: Micron Technology, Inc., Boise, ID (US)

(72) Inventors: Shing-Yih Shih, New Taipei (TW); Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/021,383

(22) Filed: Jun. 28, 2018

(65) Prior Publication Data
US 2018/0315718 A1  Nov. 1, 2018

Related U.S. Application Data

(62) Division of application No. 14/923,449, filed on Oct. 27, 2015, now Pat. No. 10,056,338.

(51) Int. Cl.
H01L 23/48 (2006.01)
H01L 23/00 (2006.01)
H01L 23/31 (2006.01)
H01L 21/48 (2006.01)
H01L 21/56 (2006.01)
H01L 23/538 (2006.01)

(52) U.S. Cl.
CPC .......... *H01L 23/562* (2013.01); *H01L 21/481* (2013.01); *H01L 21/561* (2013.01); *H01L 21/565* (2013.01); *H01L 23/3135* (2013.01); *H01L 23/5384* (2013.01); *H01L 24/11* (2013.01); *H01L 24/14* (2013.01); *H01L 24/97* (2013.01); *H01L 23/3128* (2013.01); *H01L 24/16* (2013.01); *H01L 2224/16* (2013.01); *H01L 2224/16225* (2013.01); *H01L 2224/16235* (2013.01); *H01L 2924/00014* (2013.01); *H01L 2924/014* (2013.01); *H01L 2924/181* (2013.01); *H01L 2924/3511* (2013.01)

(58) Field of Classification Search
None
See application file for complete search history.

(56) References Cited

U.S. PATENT DOCUMENTS 8,080,445 B1 * 12/2011 Pagaila ................... H01L 24/17
438/106
8,421,244 B2  4/2013 Hwang et al.
(Continued)

FOREIGN PATENT DOCUMENTS

TW  201507075 A  2/2015

OTHER PUBLICATIONS

Chinese Office Action and Search Report from Chinese Application No. 201610102285.9, dated Jul. 11, 2018, 16 pages with English translation.
(Continued)

Primary Examiner — Hung K Vu
(74) Attorney, Agent, or Firm — TraskBritt

(57) ABSTRACT

Some embodiments of the present disclosure disclose a method for forming semiconductor packages. The method includes disposing a plurality of semiconductor chips over a top side of a wafer, molding the plurality of semiconductor chips with a first molding material, and after molding the semiconductor chips, forming a composite layer over the plurality of semiconductor chips.

19 Claims, 10 Drawing Sheets

(56) References Cited

U.S. PATENT DOCUMENTS

| | | |
|---|---|---|
| 2010/0109169 A1 | 5/2010 | Kolan et al. |
| 2011/0298101 A1 | 12/2011 | Pagaila et al. |
| 2013/0341784 A1* | 12/2013 | Lin ......................... H01L 24/19 257/737 |
| 2014/0091454 A1* | 4/2014 | Lin ......................... H01L 24/19 257/734 |
| 2014/0147970 A1 | 5/2014 | Kim et al. |
| 2015/0048503 A1 | 2/2015 | Chiu et al. |
| 2015/0187607 A1* | 7/2015 | Huang ................... H01L 21/565 438/126 |
| 2015/0262928 A1* | 9/2015 | Shen ..................... H01L 23/315 257/676 |
| 2017/0117232 A1 | 4/2017 | Shih et al. |

OTHER PUBLICATIONS

Chinese Rejection Decision from Chinese Application No. 201610102285.9, dated Jul. 17, 2019, 13 pages.
Chinese Office Action from Chinese Application No. 201610102285.9, dated Feb. 2, 2019, 8 pages.
Chinese Notice of Reexamination for Chinese Application No. 201610102285.9, dated Apr. 10, 2020, 17 pages.

* cited by examiner

SEMICONDUCTOR PACKAGES AND DEVICES

CROSS-REFERENCE TO RELATED APPLICATION

This application is a divisional of U.S. patent application Ser. No. 14/923,449, filed Oct. 27, 2015, now U.S. Pat. No. 10,056,338, issued Aug. 21, 2018, the disclosure of which is hereby incorporated herein in its entirety by this reference.

TECHNICAL FIELD

The present disclosure relates to a semiconductor package. More particularly, the present disclosure relates to a method of fabricating a semiconductor package.

BACKGROUND

Semiconductor packages may be formed using a variety of techniques. Some techniques, such as a grinding process or thinning process, may produce forces exerted on the semiconductor packages or semi-finished semiconductor packages. To some extent, the semiconductor packages may be damaged or warped under exerted forces. Therefore, the fabrication of the semiconductor packages also needs some additional structures to provide support and enhancement to the semiconductor packages. For example, molding the semiconductor packages with a molding material is often adopted in conventional fabrication of the semiconductor packages, preventing the semiconductor packages being damaged or warped under the forces. That is to say, the molding material could function as a support and an enhanced structure within the semiconductor packages.

However, since semiconductor packages are becoming increasingly thinner, and include fine embedded structures inside the substrate, such as through silicon vias (TSVs) or redistribution trace, so that the semiconductor packages become more vulnerable under applied forces. Consequently, the available structure of semiconductor packages, as described above, apparently exists with inconvenience and defect, which needs further improvement. To deal with the aforementioned problem, practitioners of ordinary skill in the art have striven to attain a solution, and the problem still lacks a suitable solution. Therefore, to deal with the aforementioned problem effectively is an important subject of research and development, and also a desired improvement in the art.

SUMMARY

The present disclosure provides a method for forming semiconductor packages. The method includes disposing semiconductor chips over the top side of a wafer; molding the semiconductor chips with a first molding material, and after molding the semiconductor chips, forming a composite layer over the semiconductor chips.

The present disclosure provides a semiconductor package. The semiconductor package includes a wafer, a semiconductor chip, a first molding material, and a composite layer. The semiconductor chip is disposed over a top side of the wafer. The first molding material surrounds the semiconductor chip. The composite layer is disposed over the semiconductor chip. The composite layer includes a first inter-layer, and a second molding material. The second molding material is disposed on a surface of the first inter-layer away from the semiconductor chip.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
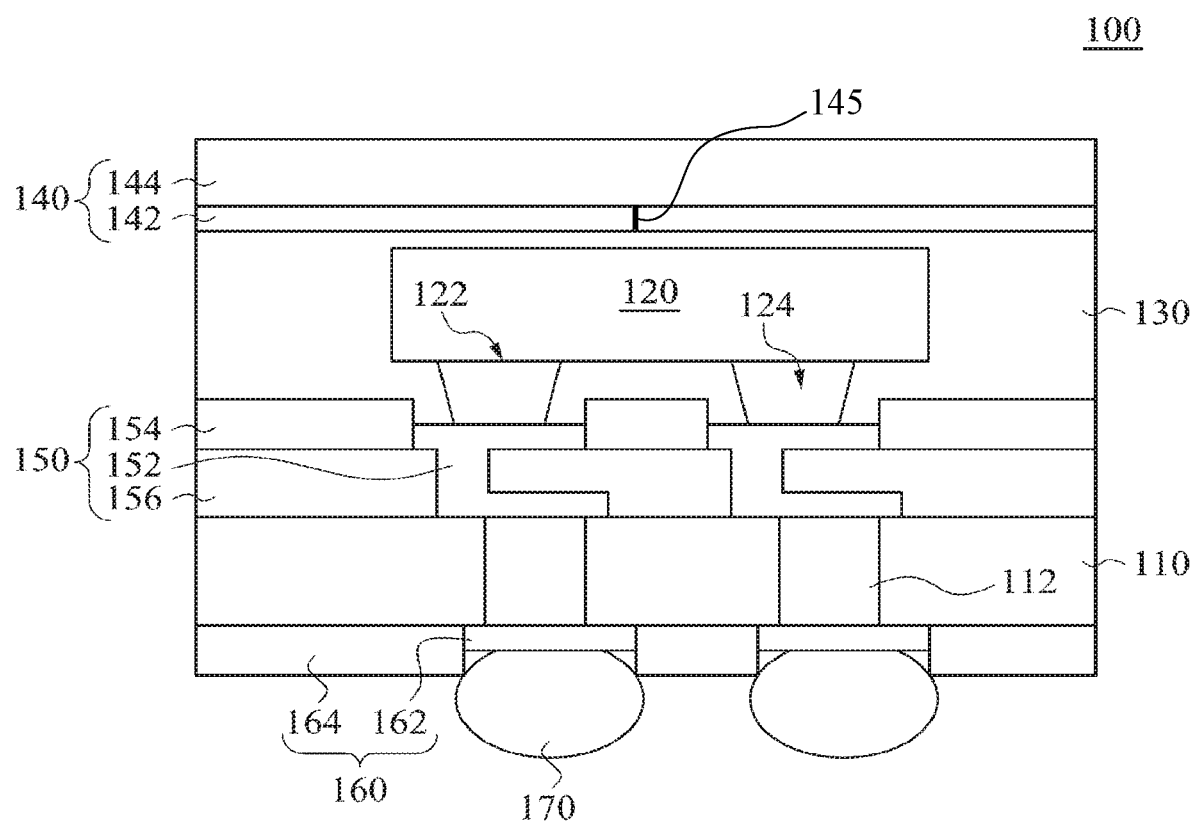
FIG. 1 is a cross-sectional view of a semiconductor package according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" or "over" another element, it can be directly on the other element or intervening elements may be present therebetween. In contrast, when an element is referred to as being "directly on" another element, there are no intervening elements present.

FIG. 1 illustrates a cross-sectional view of a semiconductor package 100 according to an embodiment of the present disclosure. The semiconductor package 100 includes a wafer 110, a semiconductor chip 120, a first molding material 130, and a composite layer 140. In some embodiments, the wafer 110 of the semiconductor package 100 can also be granted as a substrate. In some embodiments, the wafer 110 can be formed by a silicon-based substrate, a germanium-based substrate or other suitable substrate. The semiconductor chip 120 is disposed over the top side of the wafer 110. It should be noted that, in some embodiments, the semiconductor package 100 can include at least one semiconductor chip 120, the single semiconductor chip 120, drawn and described herein, is only an example, not to limit the semiconductor package 100 as a semiconductor package including a single semiconductor chip 120 only. The first molding material 130 is formed to surround the semiconductor chip 120. In some embodiments, the first molding material 130 is formed to encapsulate the semiconductor chip 120. The composite layer 140 is disposed over the semiconductor chip 120. In some embodiments, the composite layer 140 includes a first inter-layer 142 and a second molding material 144. In some embodiments, the first inter-layer 142 may be a lamination, a film, a metal material, or other suitable material. In some embodiments, the first inter-layer 142 may also include metal traces 145 (not shown), which will be described in detail below. In some embodiments, the second molding material 144 is disposed on a surface of the first inter-layer 142 away from the semiconductor chip 120. In some embodiments, the first molding material 130 and the second molding material 144 are using same molding compound. In some embodiments, the first molding material 130 and the second molding material 144 are using different molding compounds. In some embodiments, thermal expansion coefficients of the first molding material 130 and the second molding material 144 are chosen to be compatible with each other. In some embodiments, the wafer 110 may include a plurality of through silicon vias (TSVs) 112 embedded inside the wafer 110, which will be described in detail below.

Therefore, the novel structure of the semiconductor package 100 could be regarded as the first inter-layer 142 being sandwiched between the first molding material 130 and the second molding material 144, so that the composite layer 140 could provide support and enhancement to the semiconductor package 100. The second molding material 144 may also be configured to balance the force induced by the first molding material 130, such as thermal expansion, in a manner such that cooperates with the first inter-layer 142 in between the first molding material 130 and the second molding material 144, so that the structure of the semiconductor package 100 could prevent the package from being warped or damaged under various conditions. That is, the composite layer 140 serves to ensure enhancement of the semiconductor package 100, preserve the thinning tendency, and also save usage of materials compared to the semiconductor package totally encapsulated with molding material.

In some embodiments of the present disclosure, the wafer 110 may include a plurality of through silicon vias 112 disposed inside the wafer, in which the through silicon vias 112 are exposed on the top side of the wafer 110 and electrically connected to the semiconductor chip 120. More specifically, the semiconductor chip 120 may include a plurality of contact pads 122, and the contact pads 122 are electrically connected to the through silicon vias 112 through the conductive columns 124. It should be understood that the conductive pathway between the through silicon vias 112 and the semiconductor chip 120 described herein is only an exemplar, not intended to limit the connection between the through silicon vias 112 and the semiconductor chip 120. In some embodiments, the semiconductor package 100 may further include an interposer layer 150 disposed between the wafer 110 and the semiconductor chip 120. The interposer layer 150 may include a plurality of interconnect structures 152 disposed inside an interposer substrate 156, and the interconnect structures 152 are electrically connected between the corresponding through silicon vias 112 and the corresponding semiconductor chip 120. The interposer layer 150 may further comprise a passivation layer 154 disposed on the interposer substrate 156 and between the interconnect structures 152, so that the passivation layer 154 could prevent the interconnect structures 152 from being mutually connected to each other.

In some embodiments of the present disclosure, the semiconductor package 100 may further include a plurality of electric bumps disposed on a surface of the wafer 110 away from the semiconductor chip 120, in which the electric bumps are electrically connected to semiconductor chip 120 through the through silicon vias 112. In some embodiments, the electric bumps may include solder balls 170. In alternative embodiments, the electric bumps may include a redistribution layer 160 and solder balls 170. The redistribution layer 160 is disposed on the surface of the wafer 110 away from the semiconductor chip 120. The redistribution layer 160 includes a substrate 164 and a plurality of electric pads 162. In some embodiments, the solder balls 170 are disposed on a surface of the redistribution layer 160 away from the wafer 110, and electrically connected to the through silicon vias 112 through the redistribution layer 160. More specifically, the solder balls 170 are disposed on the electric pads 162, so that the solder balls 170 could be electrically connected to the through silicon vias 112 and form a conductive pathway to the semiconductor chip 120.

Figure 2:
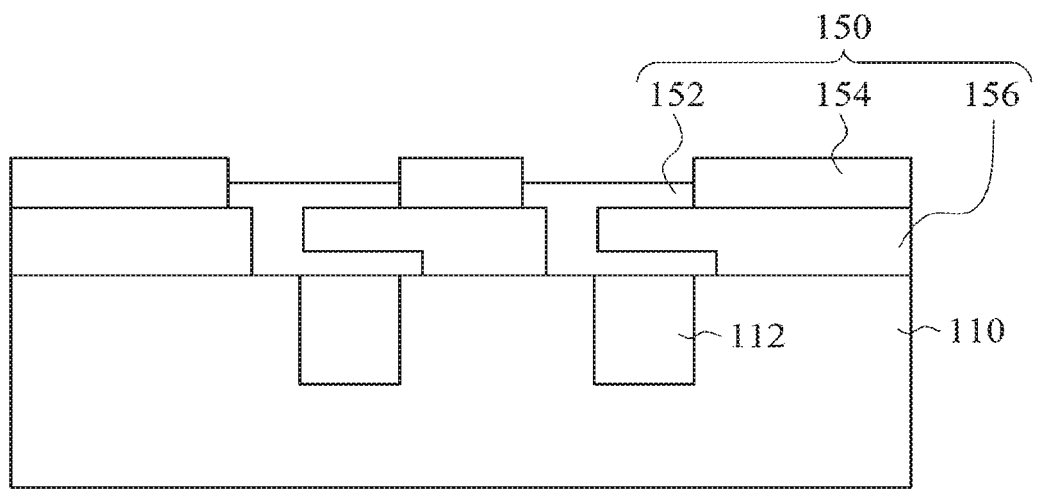
FIG. 2 to FIG. 8 are simplified, fragmentary cross-sectional views of a semiconductor package at various stages according to an embodiment of the present disclosure.

FIG. 2 to FIG. 8 illustrate simplified fragmentary cross-sectional views of a semiconductor package 100 at various stages according to an embodiment of the present disclosure. Referring to FIG. 2, a wafer 110 and an interposer layer 150 are provided. The interposer layer 150 is disposed on the wafer 110. In some embodiments, a wafer 110 may include a plurality of through silicon vias 112 disposed inside the wafer 110. It should be noted that the wafer 110 could be provided without the interposer layer 150 or any embedded structure, and the fabrication stage of semiconductor package 100 described herein may be an exemplar, not intended to limit the structures disposed inside the wafer 110. In some embodiments, the through silicon vias 112 are only exposed on the top side of the wafer in the present stage. Stated differently, each of the through silicon vias 112 has two ends, but only the end closed to the top side of the wafer 110 is exposed in present stage, another end of the through silicon vias 112 is encapsulated by the wafer 110, which will be exposed in subsequent processes. The through silicon vias 112 inside the wafer 110 may be produced by one or more processes. In some embodiments, the interposer layer 150 may include a plurality of interconnect structures 152, a passivation layer 154, and an interposer substrate 156. In some embodiments, the interposer layer 150 may be produced by one or more processes on the top side of the wafer 110. In some embodiments, the interconnect structures 152 of the interposer layer 150 may be electrically connected to the through silicon vias 112.

Figure 3:
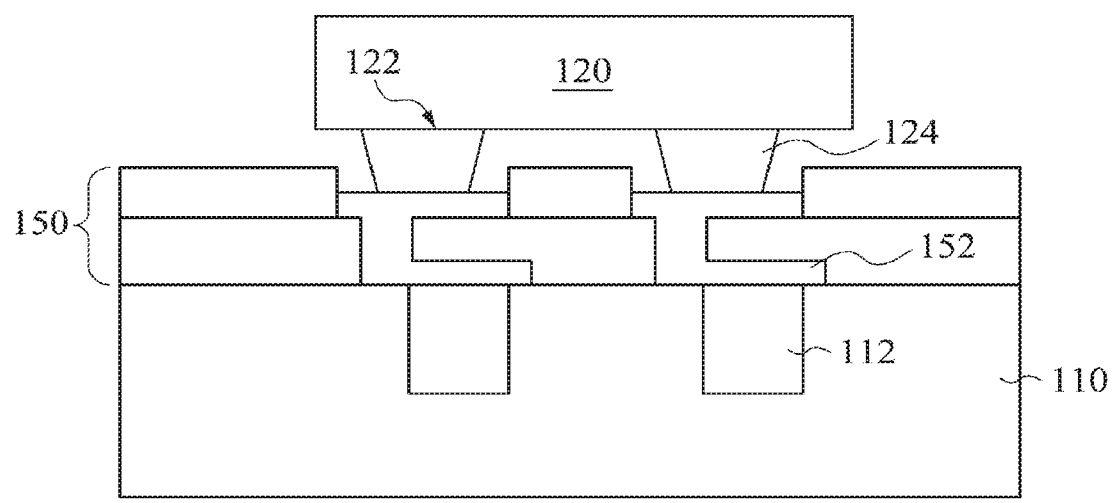

Referring to FIG. 3, a semiconductor chip 120 is disposed over the top side of the wafer 110. In some embodiments, the semiconductor chip 120 may have an active surface facing toward the wafer 110, and the contact pads 122 on the active surface of the semiconductor chip 120 are provided. The contact pads 122 are configured to electrically connect the semiconductor chip 120 to other components. In some embodiments, conductive columns 124 may be disposed between the wafer 110 and the semiconductor chip 120. In some embodiments, the conductive column 124 and the interconnect structure 152 conform a conductive pathway between the corresponding semiconductor chip 120 and the corresponding through silicon via 112. It should be noted that the conductive pathway described herein is only an exemplar, not intended to limit the connection between the semiconductor chip 120 and the through silicon vias 112.

Figure 4:
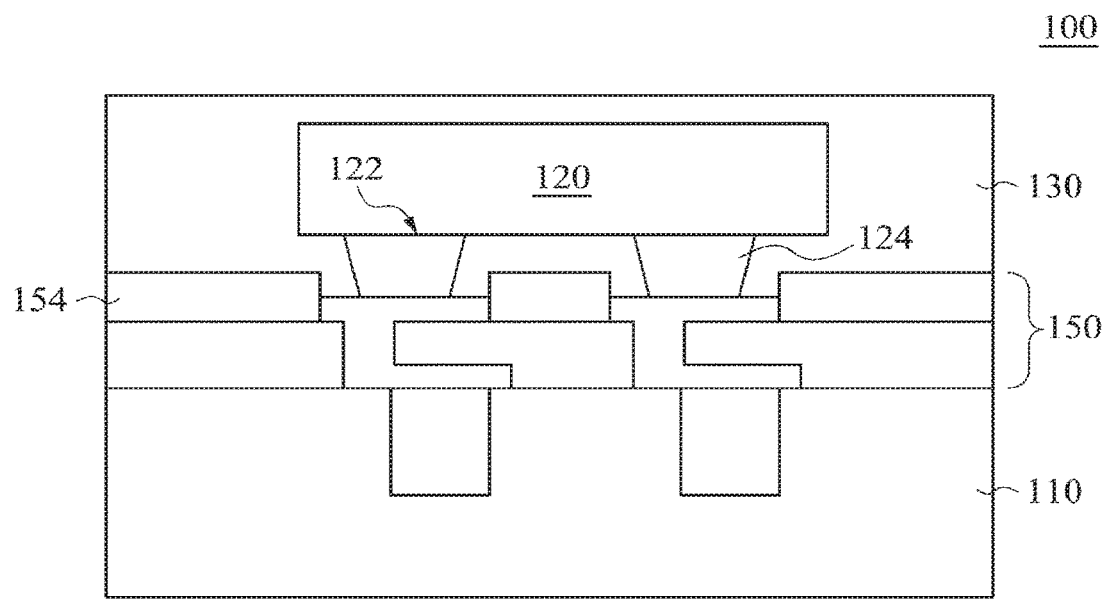

Referring to FIG. 4, the semiconductor chip 120 is molded with the first molding material 130. In some embodiments, the semiconductor chip 120 may be entirely encapsulated inside the first molding material 130. In alternative embodiments, at least a part of a surface of the semiconductor chip 120 away from the wafer 110 may be exposed, which will be described in detail below. In some embodiments, the molding of the semiconductor chip 120 may be achieved by proceeding with various processes, for example, molding, partially molding, and grinding processes. That is, after molding the semiconductor chip 120 with the first molding material 130, alternatively, a grinding or thinning process could be performed from a surface of the first molding material 130 away from the wafer 110 to remove the first molding material 130 over the semiconductor chip 120 in a manner such that the thickness of the first molding material 130 is diminished, or moreover, the surface of the semiconductor chip 120 away from the wafer 110 is exposed. After the grinding or thinning process has been performed, the semiconductor chip 120 is still surrounded by the first molding material 130, such that the first molding material 130 remains protecting the semiconductor chip 120. Among other things, the molding process may be a partial molding process, and at least a part of the surface of the semiconductor chip 120 away from the wafer 110 is exposed. Stated differently, the first molding material 130 is formed to cover at least part of the surface of the semiconductor chip 120 away from the wafer 110. In the present embodiment, as shown in FIG. 4, the surface of the semiconductor chip 120 away from the wafer 110 is still covered by the first molding material 130, then may proceed to subsequent processes.

Figure 5:
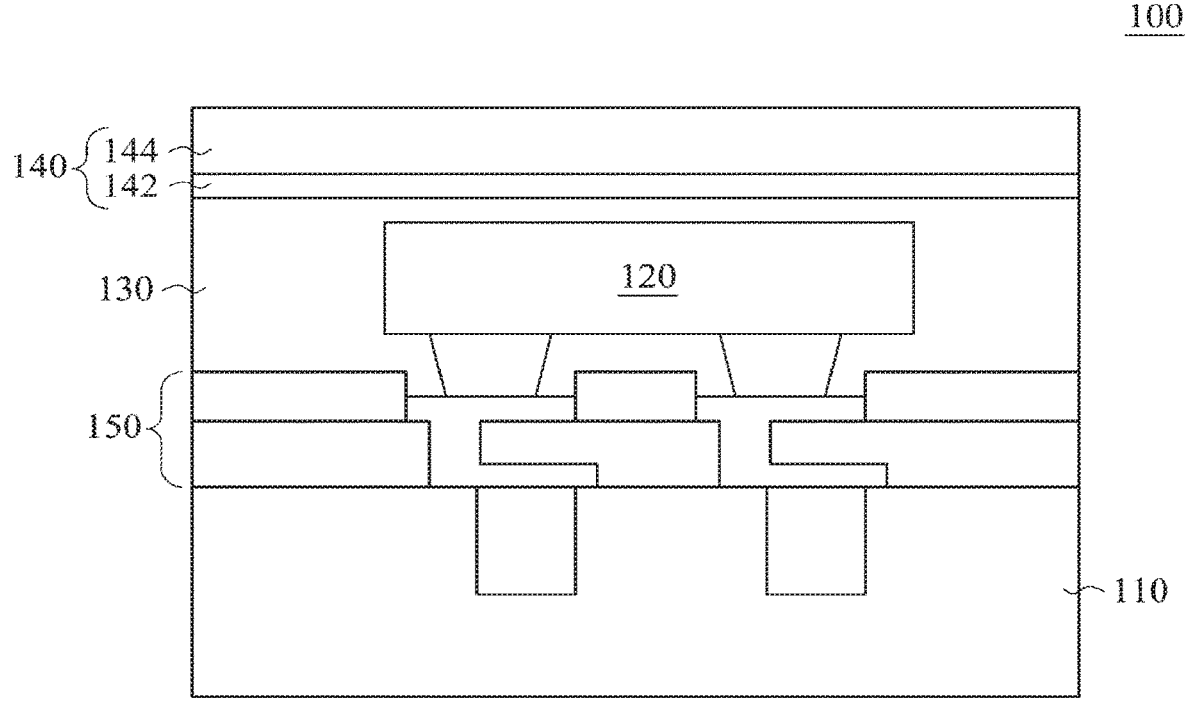

Referring to FIG. 5, after the semiconductor chip 120 is molded with the first molding material 130, the composite layer 140 is formed over the semiconductor chip 120. In some embodiments, the first molding material 130 may be disposed between the composite layer 140 and the semiconductor chip 120. The composite layer 140 includes a first inter-layer 142 and a second molding material 144. In some embodiments, the first inter-layer 142 may be bonded or attached to a surface of the first molding material 130 away from the wafer 110. The second molding material 144 is formed on a surface of the first inter-layer 142 away from the first molding material 130, before or after the first inter-layer 142 being attached or bonded onto the surface of the first molding material 130. In some embodiments, the forming of the second molding material 144 may also include a grinding or polishing process performed on the second molding material 144 from a surface of the second molding material 144 away from the wafer 110.

Figure 6:
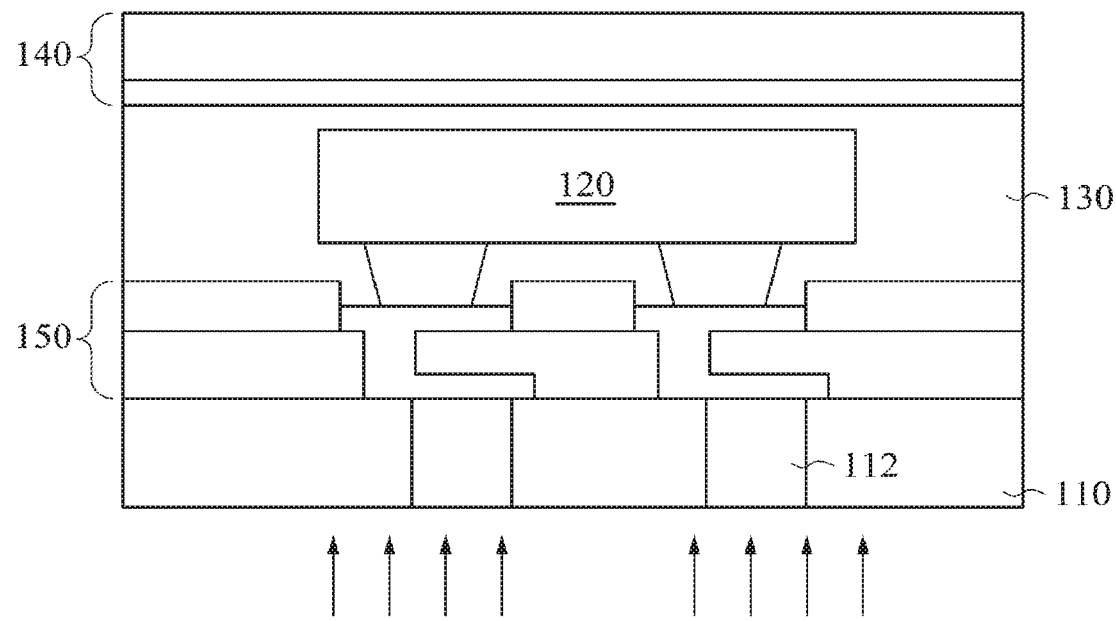

Referring to FIG. 6, the wafer 110 is ground or thinned from a bottom side of the wafer 110 opposite the top side, the process keeps proceeding to at least thin the wafer 110 until the end of the through silicon via 112 embedded inside the wafer 110 has been exposed on the bottom side of the wafer 110. As a consequence, the semiconductor chip 120 could be electrically connected to other elements through the through silicon vias 112. In some embodiments, the composite layer 140 regarded as an enhanced structure may also provide the half-finished semiconductor package 100 enhancement and support, during the grinding or thinning process is proceeding.

Figure 7:
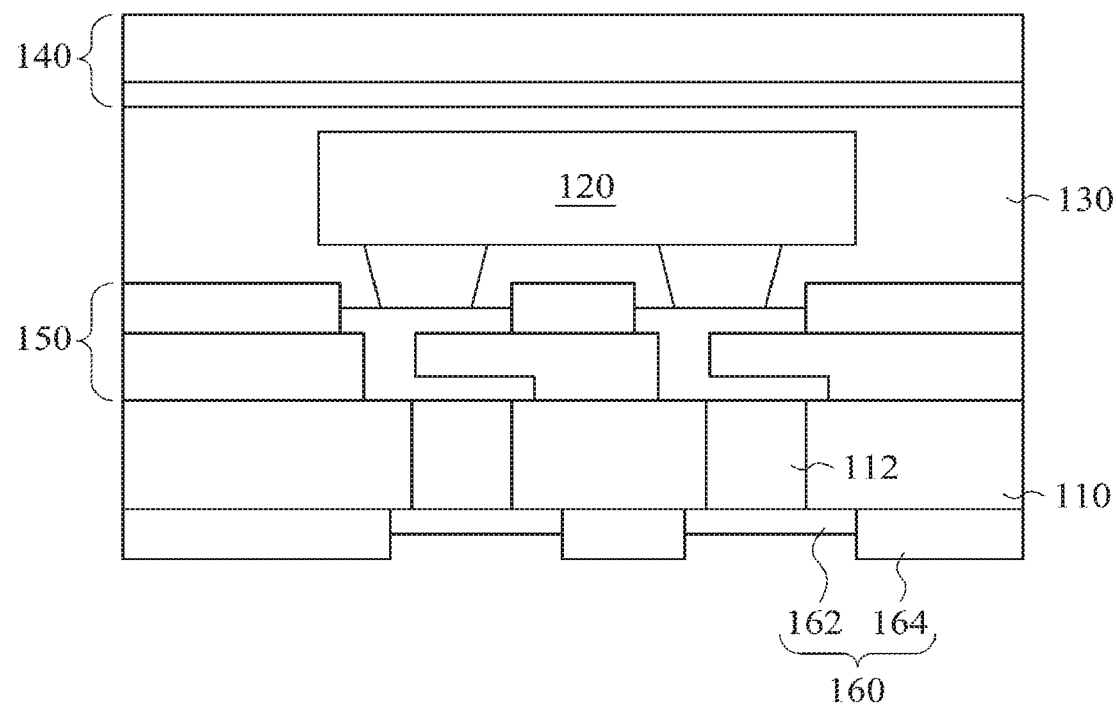

Referring to FIG. 7, a redistribution layer 160 is formed on the bottom side of the wafer 110. The redistribution layer 160 includes a substrate 164 and a plurality of electric pads or traces 162. The electric pads 162 are electrically connected to the semiconductor chips 120.

Figure 8:
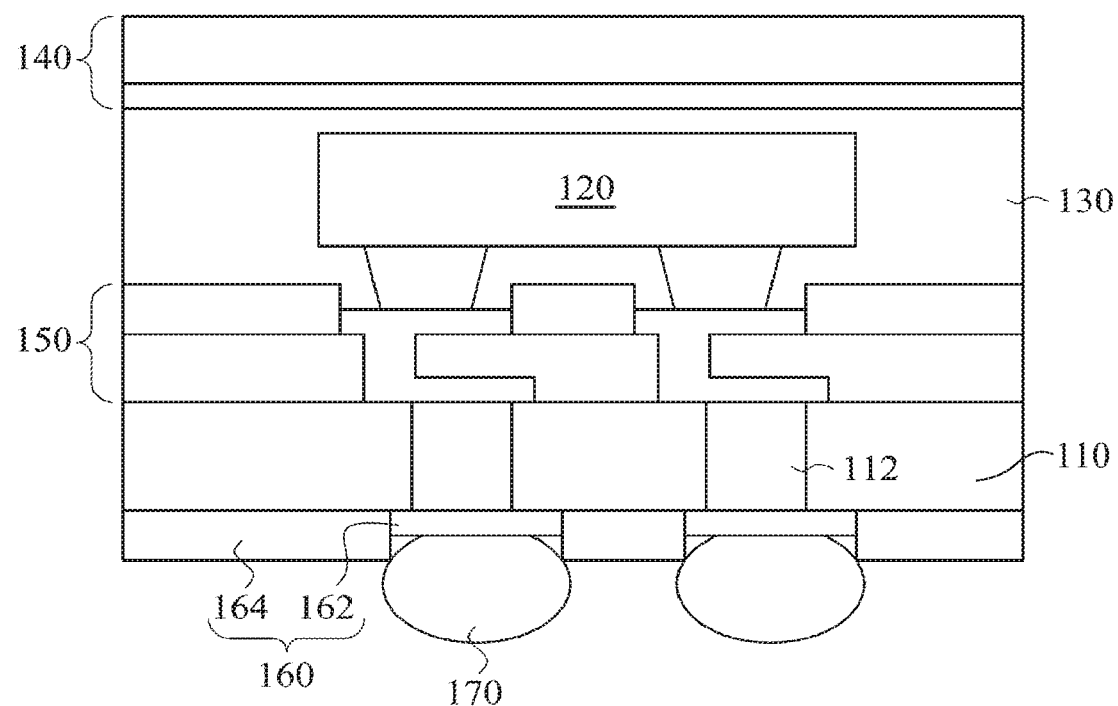

Referring to FIG. 8, a plurality of solder balls 170 are disposed on the bottom side of the wafer 110 away from the semiconductor chip 120, and electrically connected to the semiconductor chip 120. More specifically, the solder balls 170 are disposed on the electric pads 162 of the redistribution layer 160. Stated differently, the redistribution layer 160 is disposed or formed between the solder balls 170 and the wafer 110, and conforms to the solder balls 170 to form a plurality of electric bumps on the bottom side of the wafer 110 away from the semiconductor chip 120.

Figure 9:
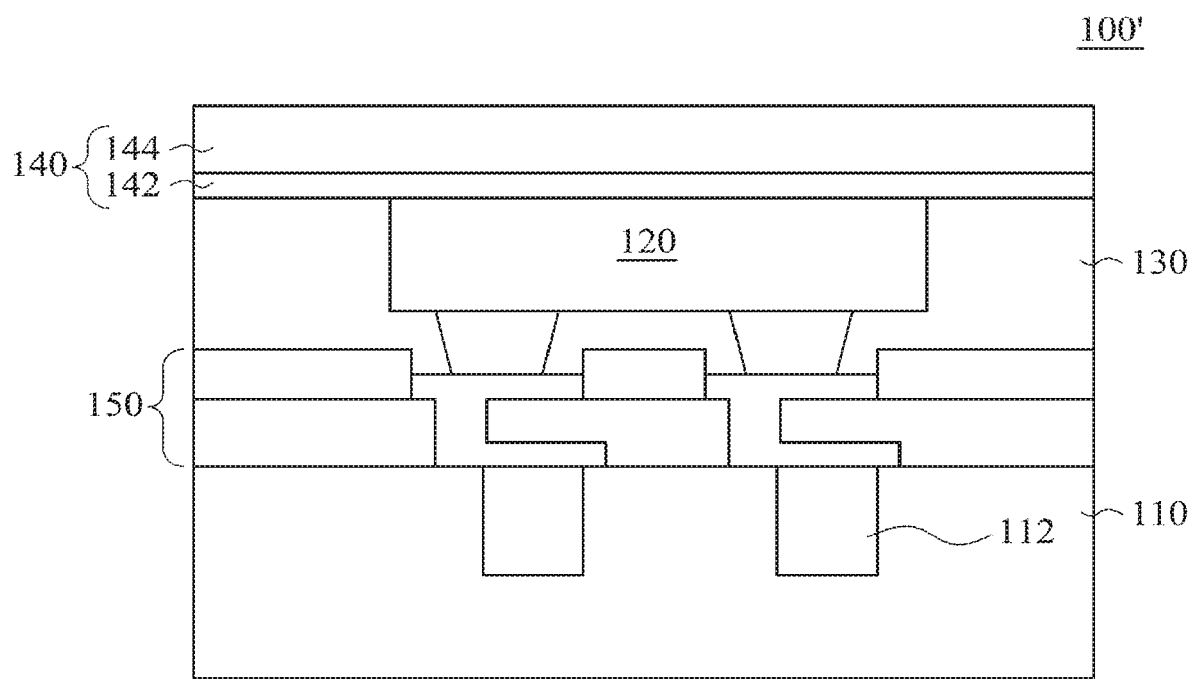
FIG. 9 to FIG. 12 are simplified, fragmentary cross-sectional views of a semiconductor package at various stages according to an alternative embodiment of the present disclosure.

FIG. 9 to FIG. 12 illustrate simplified, fragmentary cross-sectional views of a semiconductor package 100' at various stages according to an alternative embodiment of the present disclosure. The semiconductor package 100', drawn herein from FIG. 9 to FIG. 12, continues subsequent processes from the stage that the first molding material 130 is formed to surround or encapsulate the semiconductor chip 120, shown in FIG. 4. As shown in FIG. 9, before the composite layer 140 is formed over the semiconductor chip 120, the surface of the semiconductor chip 120 away from the wafer 110 is only partially covered by the first molding material 130, or moreover, the surface of the semiconductor chip 120 is fully exposed. In some embodiments, after molding the semiconductor chip 120 with the first molding material 130, a grinding or thinning process could be proceeded from the surface of the first molding material 130 away from the wafer 110 to remove the first molding material 130 over the semiconductor chip 120, therefore, a surface of the semiconductor chip 120 away from the wafer 110 is partially or fully exposed. It should be noted that, even after the grinding or thinning process has been performed, the semiconductor chip 120 is still surrounded by the first molding material 130. Then, the composite layer 140 may be formed over, or more specifically, directly on the semiconductor chip 120 and the first molding material 130. Stated differently, the composite layer 140 physically contacts at least a part of the surface of the semiconductor chip 120 away from the wafer 110. That is, if any force is exerted on the semiconductor chip 120, the force would be directly transmitted to the composite layer 140, so as to avoid or prevent the semiconductor chip 120 from being damaged.

In some embodiments of the present disclosure, the first inter-layer 142 of the composite layer 140 may include metal traces (not shown) embedded inside. Meanwhile, the semiconductor chip 120 further includes another active surface (not shown) located on the surface of the semiconductor chip 120 away from the wafer 110, so that the active surface could be electrically connected to the metal traces to create another conductive pathway for the semiconductor chip 120.

Figure 10:
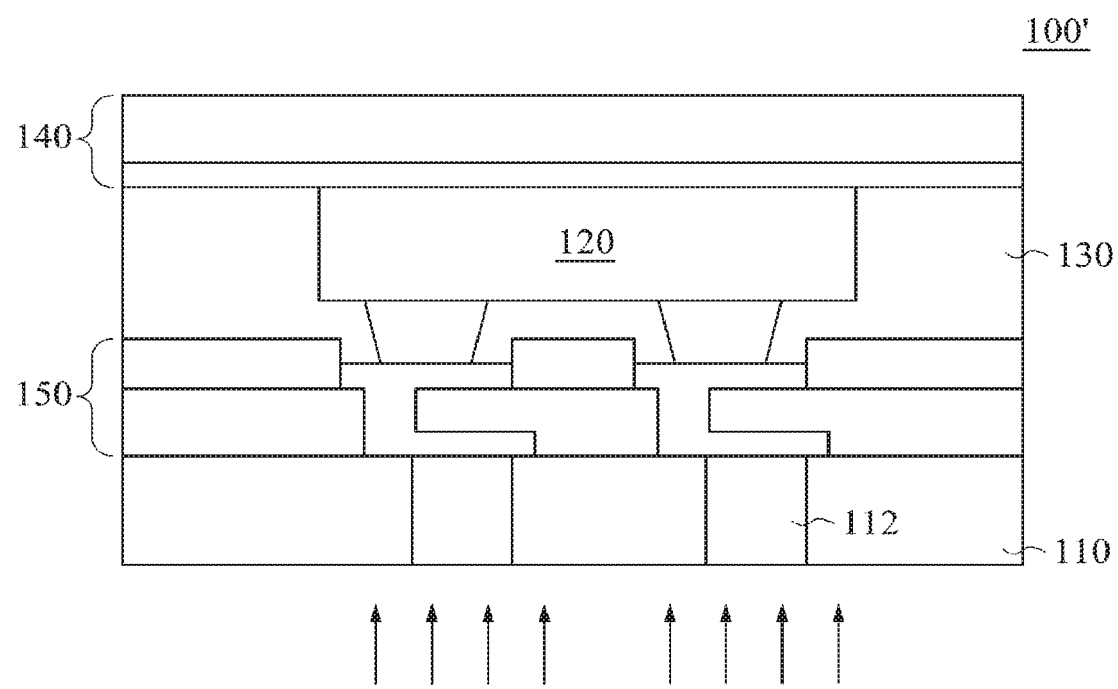

Referring to FIG. 10, the wafer 110 is ground or thinned from the bottom side of the wafer 110, to at least thin the wafer 110 until the end of the through silicon via 112 embedded inside the wafer 110 being exposed on the bottom side of the wafer 110. In some embodiments, the composite layer 140 directly against the semiconductor chip 120 may provide the half-finished semiconductor package 100' enhancement and support, as the grinding or thinning process is proceeding.

Figure 11:
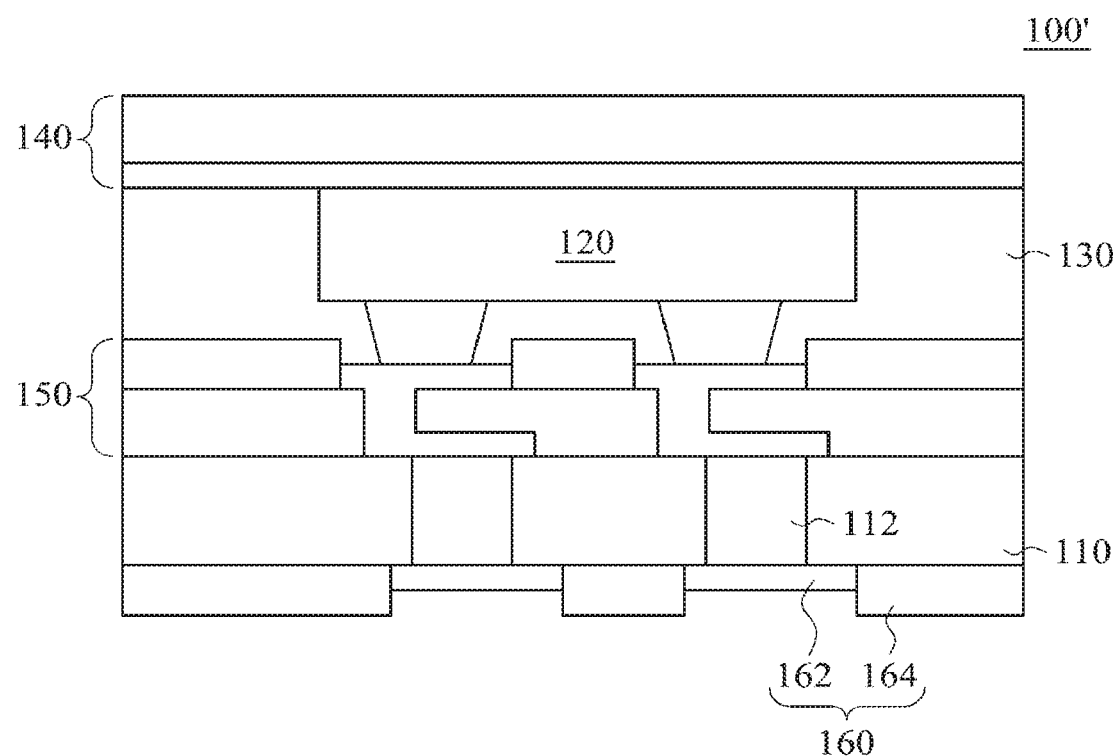
Figure 12:
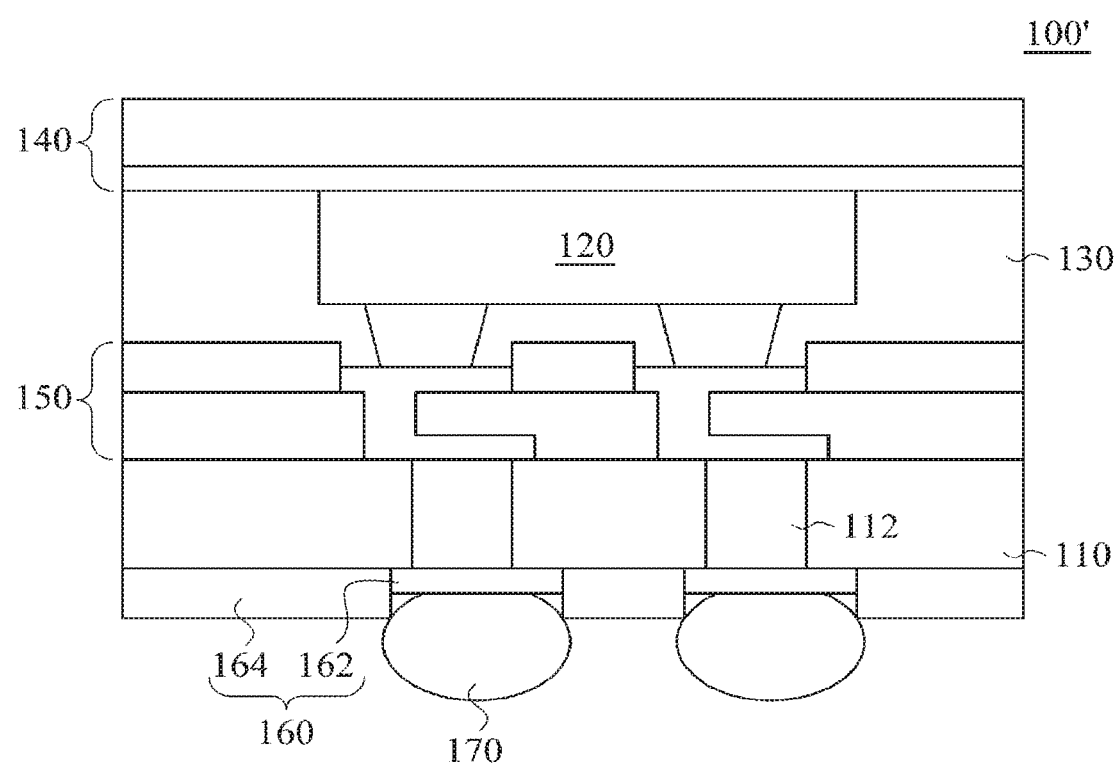

Referring to FIG. 11 and FIG. 12, a plurality of electric bumps are formed on the bottom side of the wafer 110 away from the semiconductor chip 120 to create electrical connecting points for other components. The processes described herein may respectively correspond to the processes described in FIG. 7 and FIG. 8.

Figure 13:
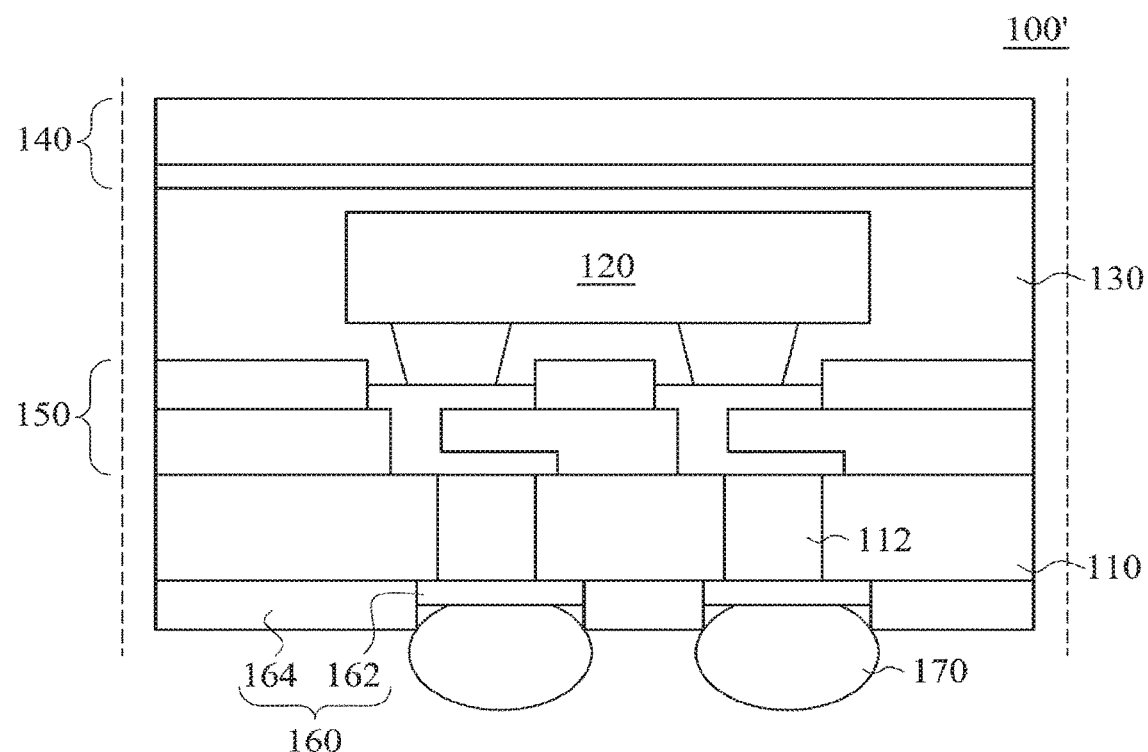
FIG. 13 is a cross-sectional view of an exemplary semiconductor package according to another embodiment of the present disclosure.

FIG. 13 illustrates a simplified fragmentary cross-sectional view of a semiconductor package 100' preceding a subsequent stage according to an embodiment of the present disclosure. Although not illustrated herein, it is understood that the wafer 110 may also have a scribe line region to singulate one semiconductor package from an adjacent semiconductor package. Dashed lines, drawn in FIG. 13, are only an exemplar to show a fabrication process to singulate the semiconductor packages 100 from other semiconductor packages adjacent to the semiconductor packages 100. The scribe line region is cut in such a way to prevent the semiconductor chip 120 and other structures inside the semiconductor packages 100 from being damaged.

Figure 14:
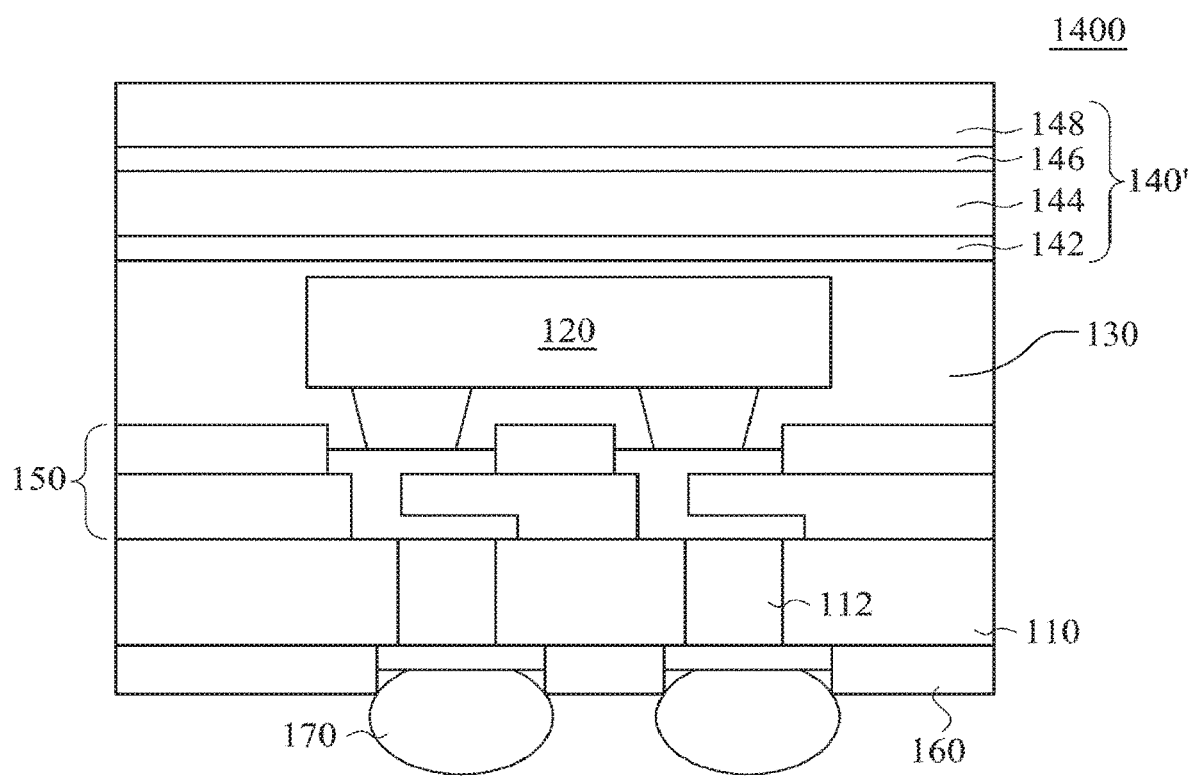
FIG. 14 is a cross-sectional view of an exemplary semiconductor package according to another embodiment of the present disclosure.

FIG. 14 illustrates a cross-sectional view of a semiconductor package 1400 according to another embodiment of the present disclosure. In some embodiments, as shown in FIG. 14, the semiconductor package 1400 may include a wafer 110, a semiconductor chip 120, a first molding material 130, a composite layer 140', an interposer layer 150, a redistribution layer 160, and solder balls 170. The first molding material 130 is disposed between the semiconductor chip 120 and the composite layer 140'. The composite layer 140' may include a first inter-layer 142, a second molding material 144, a second inter-layer 146, and a third molding material 148 stack together to form the composite layer 140'. The second inter-layer 146 is disposed on the second molding material 144. The third molding material 148 is disposed on a surface of the second inter-layer 146 away from the semiconductor chip 120. In some embodiments, the first molding material 130, the second molding material 144, and the third molding material 148 are using same molding compound. In some embodiments, the molding compounds of the first molding material 130, the second molding material 144, and the third molding material 148 may differ from each other.

Figure 15:
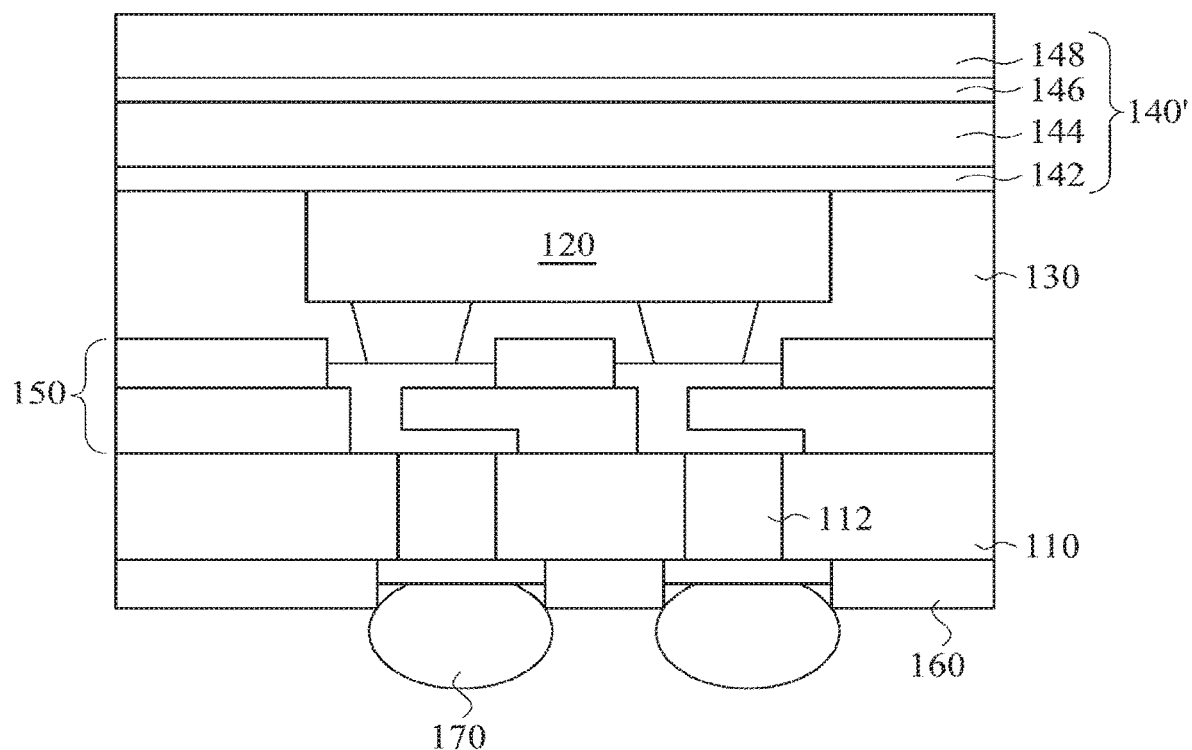
FIG. 15 is a simplified, fragmentary cross-sectional view of a semiconductor package proceeding a subsequent stage according to an embodiment of the present disclosure.

FIG. 15 illustrates a cross-sectional view of a semiconductor package 1500 according to another embodiment of the present disclosure. In some embodiments, as shown in FIG. 15 the semiconductor package 1500 may include a wafer 110, a semiconductor chip 120, a first molding material 130, a composite layer 140', an interposer layer 150, a redistribution layer 160, and solder balls 170. At least a part of a top side or surface of the semiconductor chip 120 physically contacts the composite layer 140'. In some embodiments, the first molding material 130, the second molding material 144, and the third molding material 148 are using same molding compound. In some embodiments, the molding compounds of the first molding material 130, the second molding material 144, and the third molding material 148 may differ from each other.

The composite layer 140', described herein, may also provide the semiconductor package 1400 and the semiconductor package 1500 with support and enhancement, moreover, the additional layers in the composite layer 140', such as the second inter-layer 146 and the third molding material 148, would provide more flexibility for the semiconductor package 1400 and the semiconductor package 1500. It should be noted that, the composite layer 140', described herein, is only an exemplar, not intended to limit the present disclosure, the amount of stack layers of the composite layer 140' could be adjusted to actual demand by those skilled in the art.

Figure 16:
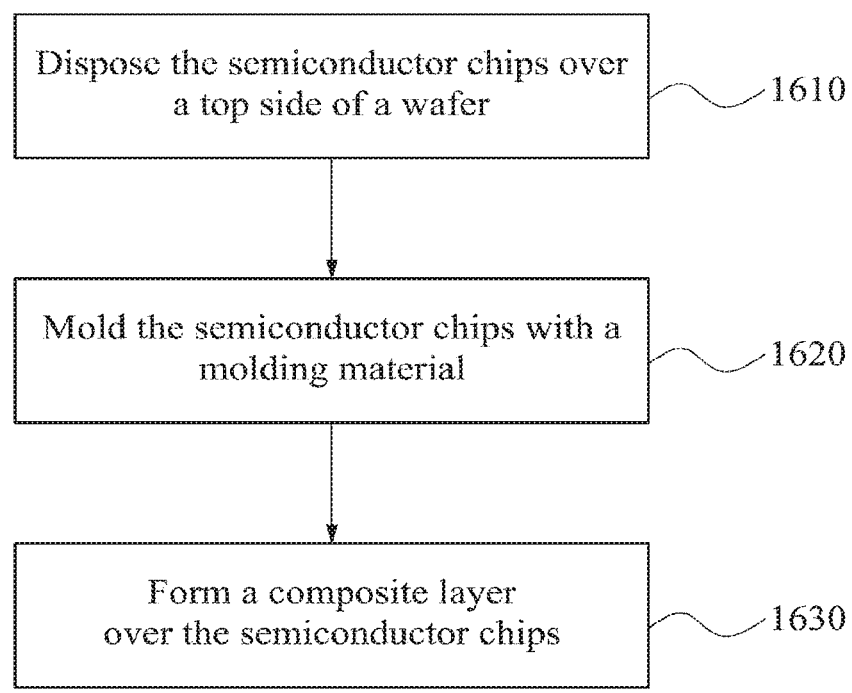
FIG. 16 is a flowchart illustrating a method of fabricating semiconductor packages according to an embodiment of the present disclosure.

FIG. 16 illustrates a flowchart illustrating a method 1600 of fabricating semiconductor packages according to an embodiment of the present disclosure. The method 1600 may include step 1610 to step 1630 sequentially performed. In step 1610, semiconductor chips are disposed over a top side of a wafer. In step 1620, the semiconductor chips are molded with a molding material. In step 1630, after molding the semiconductor chips, a composite layer is formed over the semiconductor chips. In some embodiments, forming a composite layer over the semiconductor chips may include disposing an inter-layer over the semiconductor chips and forming a molding material on the inter-layer. In some embodiments, forming a composite layer over the semiconductor chips may include disposing a first inter-layer over the semiconductor chips, forming a second molding material on the first inter-layer, and disposing a second inter-layer on the second molding material, and forming a third molding material on the second inter-layer. Therefore, the composite layer would provide the half-finished semiconductor package with support and enhancement for proceeding subsequent processes.

In some embodiments, the molding of the semiconductor chips may include molding and/or partially molding, in which the molding material produced by the partially molding still surrounds the semiconductor chips. In some embodiments, a grinding process or thinning process to thin the molding material from the surface away from the wafer, the molding material above the semiconductor chip may be thinned. In some embodiments, the molding material is disposed between the semiconductor chips and the composite layer. In another embodiment, at least a part of the surface or surface of the semiconductor chip away from the wafer may be exposed. In another embodiment, the composite layer may physically contact at least a part of the surface of the semiconductor chip away from the wafer.

In some embodiments, the wafer further has a bottom side opposite to the top side, the wafer comprises through silicon vias (TSVs) disposed inside the wafer, in which the through silicon vias are exposed on the top side of the wafer and electrically connected to the semiconductor chips. In some embodiments, the method 1600 may include forming the through silicon vias, including a front side process, such as etching the wafer, depositing a dielectric layer, a barrier layer and/or a seed layer, filling vias, polishing from a front side and depositing a metallization layer and passivation layer.

In some embodiments, the method 1600 may include disposing an interposer layer between the semiconductor chip and the wafer. In some embodiments, the interposer layer may include interconnect structures formed inside by one or more processes, and the interconnect structures are electrically connected to the semiconductor chip and the through silicon vias of the wafer.

In some embodiments, the method 1600 may include forming electric bumps on the bottom side of the wafer away from the semiconductor chip. In some embodiments, the forming of the electric bumps of the method may include grinding the wafer from the bottom side, to thin the wafer until the through silicon via is exposed on the bottom side of the wafer, and disposing solder balls on the bottom side of the wafer. In some embodiments, the method may further include forming a redistribution layer between the wafer and the solder balls.

Summarizing the above, a method of fabricating semiconductor packages and a semiconductor package produced by the method are provided. The method includes disposing semiconductor chips over a top side of a wafer, molding the plurality of semiconductor chips with a first molding material and forming a composite layer over the plurality of semiconductor chips. The semiconductor package includes a wafer, a semiconductor chip, a first molding material, and a first composite layer. The semiconductor chip is surrounded by the first molding material. The composite layer is disposed over the semiconductor chip. The composite layer includes a first inter-layer and a second molding material. The first inter-layer is disposed over the semiconductor chip, and the second molding material is formed on the first inter-layer.

Although some embodiments of the present disclosure and their advantages have been described in detail, it should be understood that various changes, substitutions, and alterations can be made without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machines, fabrications, composition of matter, means, methods, and steps described in the specification. As one of ordinary skill in the art will readily appreciate from the disclosure of the present disclosure, processes, machines, fabrications, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabrications, compositions of matter, means, methods, or steps.

What is claimed is:

1. A semiconductor package comprising:
   a substrate;
   at least one semiconductor chip disposed over the substrate;
   a first molding material surrounding the at least one semiconductor chip; and
   a composite material disposed over the at least one semiconductor chip, the composite material comprising:
      a first intermediate metal material disposed over the at least one semiconductor chip, the first intermediate metal material configured to stiffen the semiconductor package extended beyond both sides of the at least one semiconductor chip; and
      a second molding material disposed on a surface of the first intermediate metal material away from the at least one semiconductor chip, wherein the first molding material is substantially similar to the second molding material.

2. The semiconductor package of claim 1, wherein the composite material further comprises:
   a second intermediate material disposed on the second molding material; and
   a third molding material disposed on a surface of the second intermediate material away from the at least one semiconductor chip.

3. The semiconductor package of claim 2, wherein the first intermediate metal material physically contacts at least a part of the at least one semiconductor chip.

4. The semiconductor package of claim 2, wherein the first molding material is disposed between the at least one semiconductor chip and the first intermediate metal material.

5. The semiconductor package of claim 1, wherein the substrate comprises through silicon vias embedded inside the substrate, and wherein the through silicon vias are electrically connected to the at least one semiconductor chip.

6. The semiconductor package of claim 5, further comprising an interposer material disposed between the substrate and the at least one semiconductor chip, wherein the interposer material comprises interconnect structures disposed inside, and wherein the interconnect structures are electrically connected between the at least one semiconductor chip and the through silicon vias.

7. The semiconductor package of claim 5, further comprising electric bumps disposed on a surface of the substrate away from the at least one semiconductor chip, the electric bumps comprising:
   a redistribution material disposed on the surface of the substrate away from the at least one semiconductor chip; and
   solder balls disposed on a surface of the redistribution material away from the substrate, the solder balls electrically connected to the through silicon vias through the redistribution material.

8. The semiconductor package of claim 1, wherein the composite material is disposed directly on the at least one semiconductor chip.

9. The semiconductor package of claim 1, wherein the first molding material is substantially similar to the second molding material.

10. The semiconductor package of claim 9, wherein the second molding material lacks any semiconductor chips at least partially encapsulated in the second molding material.

11. The semiconductor package of claim 1, wherein an entirety of the second molding material extending from the intermediate metal material on one side of the intermediate metal material to a terminal side of the second molding material opposing the one side of the first intermediate metal material consists only of a continuous material.

12. The semiconductor package of claim 1, wherein the composite material is configured and positioned to support the semiconductor package during a process of grinding of the semiconductor package on a side of the substrate opposing the composite material to thin the substrate.

13. A semiconductor device comprising:
    a wafer;
    at least one semiconductor chip disposed over the wafer;
    a first molding material over the at least one semiconductor chip; and
    a composite material disposed over the at least one semiconductor chip, the composite material comprising:
       a second molding material substantially similar to the material of the first molding material; and
       an intermediate metal material configured to stiffen the semiconductor device positioned between the second molding material and the at least one semiconductor chip, and contacting a top surface of the at least one semiconductor chip, wherein an entirety of the second molding material extending from the intermediate metal material to a terminal side of the second molding material opposing the intermediate metal material comprises a continuous material.

14. The semiconductor device of claim 13, wherein the first molding material is the same as the second molding material.

15. The semiconductor device of claim 13, wherein the first molding material at least partially encapsulates the at least one semiconductor chip, and wherein the second molding material is substantially continuous and lacks any semiconductor chips disposed in the second molding material.

16. The semiconductor device of claim 13, wherein the composite material is disposed directly on the at least one semiconductor chip.

17. A semiconductor package comprising:
    a wafer;
    at least one semiconductor chip disposed over the wafer;
    a first molding material over the at least one semiconductor chip; and a composite material disposed over the at least one semiconductor chip, the composite material comprising:
  a second molding material, wherein the first molding material is substantially similar to the second molding material; and
  intermediate material comprising metal traces positioned between the second molding material and the at least one semiconductor chip, the metal traces contacting a top surface of the at least one semiconductor chip, the intermediate material comprising a supportive material that is configured to reinforce the semiconductor package against one or more forces applied to the semiconductor package, wherein an entirety of the second molding material consists only of a continuous material.

18. The semiconductor package of claim 17, wherein the first molding material is substantially similar to the second molding material.

19. The semiconductor package of claim 17, wherein the second molding material lacks any semiconductor chips disposed therein.

\* \* \* \* \*

UNITED STATES PATENT AND TRADEMARK OFFICE
CERTIFICATE OF CORRECTION

Page 1 of 1

PATENT NO. : 10,825,783 B2
APPLICATION NO. : 16/021383
DATED : November 3, 2020
INVENTOR(S) : Shing-Yih Shih and Tieh-Chiang Wu It is certified that error appears in the above-identified patent and that said Letters Patent is hereby corrected as shown below:

In the Specification
Column 3, Lines 10-11, change "145 (not shown)," to --145,--

In the Claims
Claim 9, Column 10, Line 17, change "substantially similar to" to --the same as--
Claim 11, Column 10, Line 24, change "intermediate metal material on one side of the intermediate" to
--first intermediate metal material on one side of the first intermediate--
Claim 18, Column 11, Line 18, change "substantially similar to" to --the same as--

Signed and Sealed this
Twenty-second Day of December, 2020

Andrei Iancu
*Director of the United States Patent and Trademark Office*